US008611816B2

(12) United States Patent
Kuroda

(10) Patent No.: US 8,611,816 B2
(45) Date of Patent: Dec. 17, 2013

(54) ELECTRONIC CIRCUIT AND COMMUNICATION FUNCTIONALITY INSPECTION METHOD

(75) Inventor: Tadahiro Kuroda, Kanagawa (JP)

(73) Assignee: Keio University, Tokyo (JP)

( * ) Notice: Subject to any disclaimer, the term of this patent is extended or adjusted under 35 U.S.C. 154(b) by 211 days.

(21) Appl. No.: 13/125,270

(22) PCT Filed: Sep. 8, 2009

(86) PCT No.: PCT/JP2009/065645
§ 371 (c)(1),
(2), (4) Date: Apr. 20, 2011

(87) PCT Pub. No.: WO2010/047186
PCT Pub. Date: Apr. 29, 2010

(65) Prior Publication Data
US 2011/0201271 A1    Aug. 18, 2011

(30) Foreign Application Priority Data
Oct. 21, 2008    (JP) .................................. 2008-270751

(51) Int. Cl.
*H04B 5/00*    (2006.01)

(52) U.S. Cl.
USPC ........................................ 455/41.1; 455/63.1

(58) Field of Classification Search
USPC ................ 455/41.1, 41.2, 41.3, 67.11, 67.12, 455/67.14, 63.1, 115.1, 115.2
See application file for complete search history.

(56) References Cited
U.S. PATENT DOCUMENTS
7,756,480 B2 *    7/2010    Loh .............................. 455/63.1

8,190,086 B2 *    5/2012    Sasaki et al. ................. 455/41.1
(Continued)

FOREIGN PATENT DOCUMENTS
JP    2003-060048 A    2/2003
JP    2004-245709 A    9/2004
(Continued)

OTHER PUBLICATIONS

Noriyuki Miura, et al.; Inductive-Coupling Link with Burst Transmission; Trends in Signal and Power Transmission; 15.7; 2008 IEEE International Solid-State Circuits Conference; pp. 298, 299, 614.

(Continued)

*Primary Examiner* — Ping Hsieh
(74) *Attorney, Agent, or Firm* — Knobbe Martens Olson & Bear LLP

(57) ABSTRACT

To provide an electronic circuit capable of easily testing semiconductor chips that are inductively coupled to each other and that communicate with each other, and an inspection method performed in the electronic circuit. An electronic circuit includes: a first substrate; a first transmission coil that is formed by a wire and transmits a signal; a first transmission circuit that outputs a signal to the first transmission coil; a first reception coil that is formed by a wire at such a position that the first reception coil is inductively coupled to the first transmission coil and receives the signal from the first transmission coil; a first reception circuit that receives the signal from the first reception coil; and a first determination circuit that compares data input to the first transmission circuit and data output from the first reception circuit, the first transmission coil, the first transmission circuit, the first reception coil, the first reception circuit and the first determination circuit being mounted on the first substrate.

6 Claims, 10 Drawing Sheets

(56) References Cited

U.S. PATENT DOCUMENTS

| | | | |
|---|---|---|---|
| 2007/0037516 A1* | 2/2007 | Sawai et al. | 455/41.1 |
| 2008/0144738 A1* | 6/2008 | Naguib | 375/299 |

FOREIGN PATENT DOCUMENTS

| | | | |
|---|---|---|---|
| JP | 2005-030877 A | 2/2005 | |
| JP | 2005-228981 A | 8/2005 | |
| JP | 2005-348264 A | 12/2005 | |
| JP | 2006-050354 A | 2/2006 | |
| JP | 2006-066454 A | 3/2006 | |
| JP | 2006-105630 A | 4/2006 | |
| JP | 2006-173986 A | 6/2006 | |
| JP | 2009-173415 A | 6/2006 | |
| JP | 2008-219873 A | 9/2008 | |
| JP | 2008-228038 A | 9/2008 | |
| WO | WO2005/013573 A1 | 2/2005 | |

OTHER PUBLICATIONS

Hiroki Ishikuro, et al.; An Attachable Wireless Chip Access Interface for Arbitrary Data Rate Using Pulse-Based Inductive-Coupling through LSI Package; Proximity Data and Power Transmission; 20.3; 2007 IEEE International Solid-State Circuits Conference; pp. 360, 361, 608.
Noriyuki Miura, et al.; Proximity Data and Power Transmission; 20.2; 2007 IEEE International Solid-State Circuits Conference; pp. 358, 359, 608.
Noriyuki Miura, et al.; A 1Tb/s 3W Inductive-Coupling Transceiver for Inter-Chip Clock and Data Link; Technology and Architecture Directions; 23.4; 2006 IEEE International Solid-State Circuits Conference; pp. 11-13.
Noriyuki Miura, et al.; A 195Gb/s 1.2W 3D-Stacked Inductive Inter-Chip Wireless Superconnect with Transmit Power Control Scheme; Low-Power Wireless and Advanced Integration; 14.5; 2005 IEEE International Solid-State Circuits Conference; pp. 264, 265, 597.
Noriyuki Miura, et al.; Cross Talk Countermeasures in Inductive Inter-chip Wireless Superconnect; Department of Electronics and Electrical Engineering, Keio University; pp. 1-4.
Noriyuki Miura, et al.; Analysis and Design of Transceiver Circuit and Inductor Layout for Inductive Inter-chip Wireless Superconnect; Department of Electronics and Electrical Engineering, Keio University; pp. 246-249.
Daisuke Mizoguchi, et al.; A 1.2Gb/s/pin Wireless Superconnect Based on Inductive Inter-chip Signaling (IIS); Scaling Trends; 7.6; 2004 IEEE International Solid-State Circuits Conference; pp. 1-3.
International Search Report; Application No. PCT/JP2009/065645.

* cited by examiner (a)

(b)

(a)

(b)

ELECTRONIC CIRCUIT AND COMMUNICATION FUNCTIONALITY INSPECTION METHOD

CROSS-REFERENCE TO RELATED APPLICATIONS

This application is the U.S. National Phase under 35. U.S.C. §371 of International Application PCT/JP2009/065645, filed Sep. 8, 2009, which claims priority to Japanese Patent Application No. 2008-270751, filed Oct. 21, 2008. The International Application was published under PCT Article 21(2) in a language other than English.

TECHNICAL FIELD

The present invention generally relates to a stacked semiconductor apparatus that comprises a stack of a plurality of devices, such as semiconductor chips and electronic circuit boards, that are inductively coupled to each other and thus can communicate with each other. More specifically, it relates to a communication functionality inspection method for checking whether the devices can normally communicate with each other in advance of their stacking in order to prevent a defective device from being included in the apparatus, and an electronic circuit suitable for the method.

BACKGROUND ART

Recently, there have been developed stacked semiconductor memory apparatuses with high capacity that comprise a stack of a plurality of semiconductor memories but can be externally controlled in the same way as a single semiconductor memory. For example, a solid state drive (SSD), which includes a nonvolatile memory instead of a magnetic hard disk, comprises a stack of a plurality of flash memory chips of the same type and has an increased storage capacity.

A package containing a stack of 64 1 GB NAND flash memories and a control chip can be externally accessed in the same way as a single 64 GB NAND flash memory. Similarly, 32 DRAM chips can be stacked to form a DRAM having 32 times as much storage capacity as a single chip. Eight microprocessor chips can be stacked to increase the number of multi-core processors eightfold.

The inventors have proposed a technique of wirelessly interconnecting the devices in the stacked semiconductor apparatus described above, which involves inductively coupling coils of wire on semiconductor chips or electronic circuit boards to establish communication (see Patent Documents 1 to 7 and Non Patent Literatures 1 to 8). Patent Document 7 describes a technique of stacking a plurality of semiconductor chips of the same type, connecting the semiconductor chips to a power supply by conventional wire bonding, and inductively coupling the semiconductor chips to establish data communication therebetween.

CITATION LIST

Patent Literature

Patent Literature 1: JP2005-228981A
Patent Literature 2: JP2005-348264A
Patent Literature 3: JP2006-050354A
Patent Literature 4: JP2006-066454A
Patent Literature 5: JP2006-105630A
Patent Literature 6: JP2006-173986A
Patent Literature 7: JP2006-173415A

Non Patent Literature

Non Patent Literature 1: D. Mizoguchi et al, "A 1.2 Gb/s/pin Wireless Superconnect based on Inductive Inter-chip Signaling (IIS)," IEEE International Solid-State Circuits Conference (ISSCC'04), Dig. Tech. Papers, pp. 142-143, 517, February 2004.
Non Patent Literature 2: N. Miura et al, "Analysis and Design of Transceiver Circuit and Inductor Layout for Inductive Inter-chip Wireless Superconnect," Symposium on VLSI Circuits, Dig. Tech. Papers, pp. 246-249, June 2004.
Non Patent Literature 3: N. Miura et al, "Cross Talk Countermeasures in Inductive Inter-Chip Wireless Superconnect," in Proc. IEEE Custom Integrated Circuits Conference (CICC'04), pp. 99-102, October 2004.
Non Patent Literature 4: N. Miura, D. Mizoguchi, M. Inoue, H. Tsuji, T. Sakurai, and T. Kuroda, "A 195 Gb/s 1.2 W 3D-Stacked Inductive Inter-Chip Wireless Superconnect with Transmit Power Control Scheme," IEEE International Solid-State Circuits Conference (ISSCC'05), Dig. Tech. Papers, pp. 264-265, February 2005.
Non Patent Literature 5: N. Miura, D. Mizoguchi, M. Inoue, K. Niitsu, Y. Nakagawa, M. Tago, M. Fukaishi, T. Sakurai, and T. Kuroda, "A 1 Tb/s 3 W Inductive-Coupling Transceiver for Inter-Chip Clock and Data Link," IEEE International Solid-State Circuits Conference (ISSCC'06), Dig. Tech. Papers, pp. 424-425, February 2006.
Non Patent Literature 6: N. Miura, H. Ishikuro, T. Sakurai, and T. Kuroda, "A 0.14pJ/b Inductive-Coupling Inter-Chip Data Transceiver with Digitally-Controlled Precise Pulse Shaping," IEEE International Solid-State Circuits Conference (ISSCC'07), Dig. Tech. Papers, pp. 264-265, February 2007.
Non Patent Literature 7: H. Ishikuro, S. Iwata, and T. Kuroda, "An Attachable Wireless Chip Access Interface for Arbitrary Data Rate by Using Pulse-Based Inductive-Coupling through LSI Package," IEEE International Solid-State Circuits Conference (ISSCC'07), Dig. Tech. Papers, pp. 360-361, 608, February 2007.
Non Patent Literature 8: N. Miura, Y. Kohama, Y. Sugimori, H. Ishikuro, T. Sakurai, and T. Kuroda, "An 11 Gb/s Inductive-Coupling Link with Burst Transmission," IEEE International Solid-State Circuits Conference (ISSCC08), Dig. Tech. Papers, pp. 298-299, February 2008.

SUMMARY OF INVENTION

Technical Problem

Assume that the fraction defective of the devices in a stacked semiconductor apparatus is D (equal to or greater than 0 and equal to or smaller than 1), the fraction defective of a stacked semiconductor apparatus including a stack of N devices is $1-(1-D)^N$. The fraction defective exponentially increases with the number of devices N. If D=3% and N=64, the fraction defective of the apparatus is 86%.

Thus, there is a strong need required to test chips and remove defective chips before stacking. That is, there is a demand for a so-called known good die (KGD).

According to a conventional technique, semiconductor chips are tested with a tester that probes a wafer before the step of die sorting, thereby screening out defective semiconductor chips. However, a pair of transceivers inductively coupled to each other is required to test the radio communication functionality of semiconductor chips that are inductively coupled to each other to communicate with each other, and therefore, the radio communication functionality of such semiconductor chips cannot be tested with the conventional test methods or testers.

The present invention has been devised in view of the problems described above, and an object of the present invention is to provide an electronic circuit that can easily test semiconductor chips that are inductively coupled to each other to communicate with each other, and an inspection method performed in the electronic circuit.

Solution to Problem

An electronic circuit according to the present invention comprises:
a first substrate;
a first transmission coil that is formed by a wire and transmits a signal;
a first transmission circuit that outputs a signal to the first transmission coil;
a first reception coil that is formed by a wire at such a position that the first reception coil is inductively coupled to the first transmission coil and receives the signal from the first transmission coil;
a first reception circuit that receives the signal from the first reception coil; and
a first determination circuit that compares data input to the first transmission circuit and data output from the first reception circuit,
the first transmission coil, the first transmission circuit, the first reception coil, the first reception circuit and the first determination circuit being mounted on the first substrate.

The electronic circuit may further comprise:
a second substrate;
a second reception coil that is formed by a wire at such a position that the second reception coil is inductively coupled to the first transmission coil and receives the signal from the first transmission coil; and
a second reception circuit that receives a signal from the second reception coil,
the second reception coil and the second reception circuit being mounted on the second substrate.

Alternatively, the electronic circuit may further comprise:
a second substrate;
a second transmission coil that is formed by a wire at such a position that the second transmission coil is inductively coupled to the first reception coil and transmits a signal to the first reception coil; and
a second transmission circuit that outputs a signal to the second transmission coil,
the second transmission coil and the second transmission circuit being mounted on the second substrate.

Alternatively, the electronic circuit may further comprise:
a second substrate;
a second reception coil that is formed by a wire at such a position that the second reception coil is inductively coupled to the first transmission coil and receives the signal from the first transmission coil;
a second reception circuit that receives a signal from the second reception coil;
a second transmission coil that is formed by a wire at such a position that the second transmission coil is inductively coupled to the first reception coil and transmits a signal to the first reception coil; and
a second transmission circuit that outputs a signal to the second transmission coil;
the second reception coil, the second reception circuit, the second transmission coil and the second transmission circuit being mounted on the second substrate.

In any of the electronic circuits described above, the first transmission circuit may be capable of setting a temporal variation rate $\delta$ of a current applied to the first transmission coil at any value.

A communication functionality inspection method according to the present invention is a communication functionality inspection method performed in the electronic circuit having the first transmission circuit capable of setting the temporal variation rate $\delta$ of the current applied to the first transmission coil at any value, in which the first transmission coil and the first reception coil are inductively coupled to each other during testing, the temporal variation rate $\delta_{test}$ of the current that is applied to the first transmission coil during testing is set to be $[(k_{12}/k_{11})\times\{\sqrt{(L_{R2}/L_{R1})}\}]$ times the temporal variation rate $\delta$ of the current that is applied to the first transmission coil during communication from the first substrate to the second substrate, where $k_{11}$ represents the coupling coefficient of the inductive coupling between the first transmission coil and the first reception coil, $k_{12}$ represents the coupling coefficient of the inductive coupling between the first transmission coil and the second reception coil, $L_{R1}$ represents the inductance of the first reception coil, and $L_{R2}$ represents the inductance of the second reception coil, and the communication functionality between the first substrate and the second substrate is inspected by the first determination circuit comparing a signal transmitted from the first transmission circuit and a signal received by the first reception circuit.

In a communication functionality inspection method according to another embodiment of the present invention, the first transmission coil and the first reception coil are inductively coupled to each other during testing, the temporal variation rate $\delta_{test}$ of the current applied to the first transmission coil during testing is set to be equal to the temporal variation rate $\delta$ of the current applied to the first transmission coil during communication from the first substrate to the second substrate, and the communication functionality between the first substrate and the second substrate is inspected by the first determination circuit comparing a signal transmitted from the first transmission circuit and a signal received by the first reception circuit.

Advantageous Effects of Invention (1) Chips can be inspected on a wafer to screen out defective chips, so that the fraction defective of a stacked apparatus can be reduced.
(2) A transmitter/receiver can be tested without an additional testing coil or transmitter/receiver, so that the cost of the chips can be reduced.
(3) A plurality of transmission/reception circuits can be tested at once.
(4) Test can be conducted under various conditions.
(5) Test can be conducted under conditions conforming to the actual communication.
(6) The transmission circuit requires no additional component for testing, so that the cost of the chips can be reduced.

DESCRIPTION OF EMBODIMENTS

In the following, embodiments of the present invention will be described with reference to the drawings.

Embodiment 1

Figure 1:
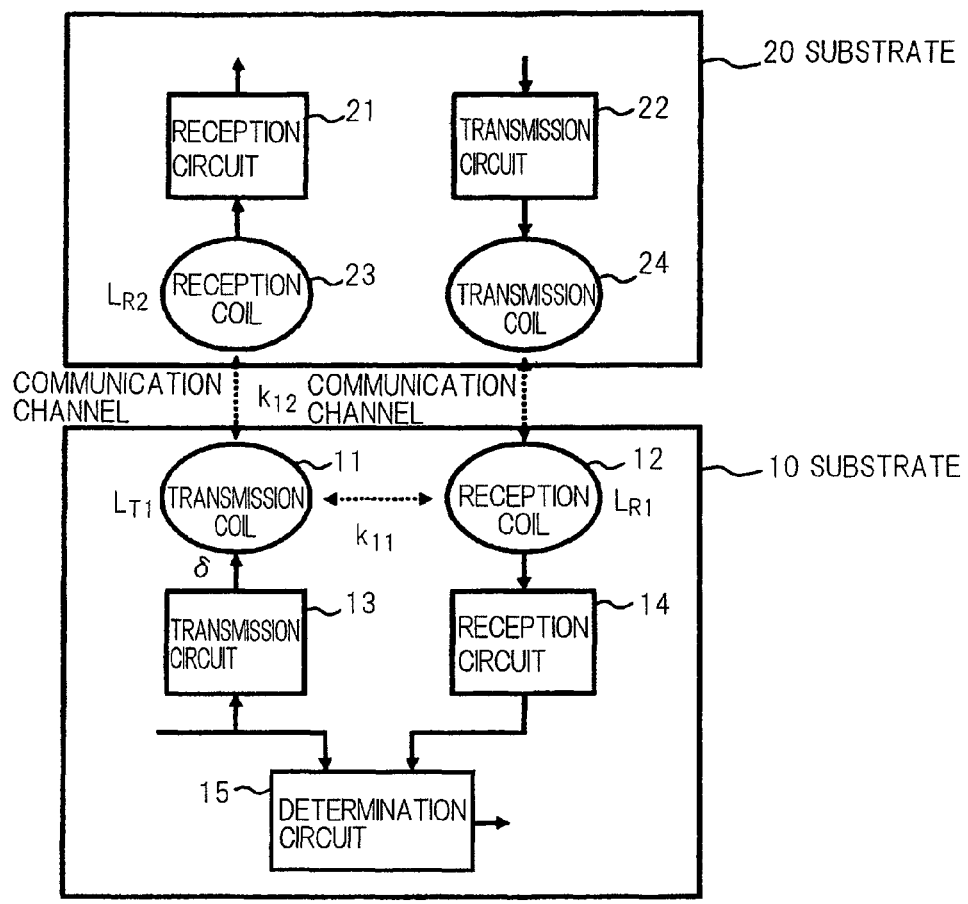
FIG. 1 is a block diagram showing a configuration of essential parts of an electronic circuit according to Embodiment 1 of the present invention.

FIG. 1 is a block diagram showing a configuration of essential parts of an electronic circuit according to Embodiment 1 of the present invention.

This embodiment comprises substrates 10 and 20. Transmission coil 11, reception coil 12, transmission circuit 13, reception circuit 14 and determination circuit 15 are mounted on substrate 10. Reception circuit 21, transmission circuit 22, reception coil 23 and transmission coil 24 are mounted on substrate 20. In addition, substrate 10 is provided with a signal input terminal and a signal output terminal (not shown), and substrate 20 is provided with a part that functions as a memory or another device (not shown).

Transmission circuit 13 changes a current $I_T$ applied to transmission coil 11 in accordance with transmission data Txdata input at the input terminal. Transmission coil 11 is inductively coupled to reception coil 12 with a coupling coefficient $k_{11}$ and to reception coil 23 with a coupling coefficient $k_{12}$.

The current $I_T$ flowing in transmission coil 11 induces a voltage signal in reception coils 12 and 23.

Reception circuit 21 has a comparator function and compares a voltage signal $V_R$ induced in reception coil 23 by the current $I_T$ in transmission coil 11 with a predetermined threshold to generate reception data Rxdata that is the same as the transmission data.

Transmission circuit 22 changes a current applied to transmission coil 24 in accordance with an input signal. Transmission coil 24 is inductively coupled to reception coil 12, and the current flowing in transmission coil 24 induces a voltage signal in reception coil 12.

Reception circuit 14 has a comparator function and compares the voltage signal induced in reception coil 12 with a predetermined threshold to generate a signal that is the same as the reception data Rxdata.

Determination circuit 15 compares the transmission data Txdata with a signal generated by reception circuit 14 in response to inductive coupling between transmission coil 11 and reception coil 12, thereby determining whether transmission circuit 13, reception circuit 14, transmission coil 11 and reception coil 12 on substrate 10 operate normally. Then, determination circuit 15 outputs a signal indicating the result of the determination from the output terminal.

Radio communication functionality of the components on substrate 10 that are inductively coupled to each other is tested as described above.

Figure 2:
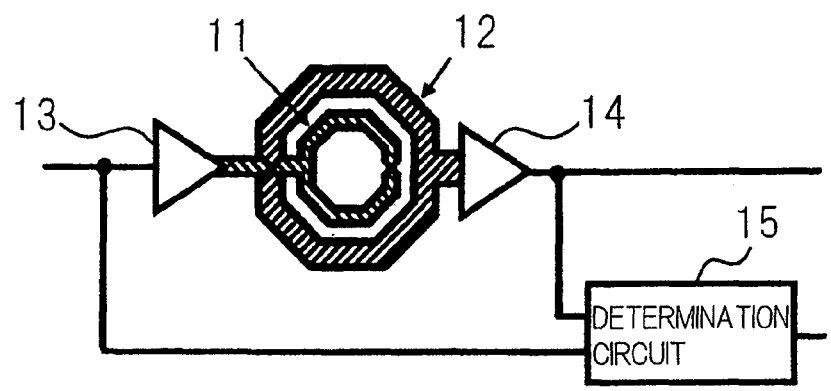
FIGS. 2(a) and 2(b) show positional relationships between transmission coil 11 and reception coil 12 provided on substrate 10 shown in FIG. 1.
Figure 2:
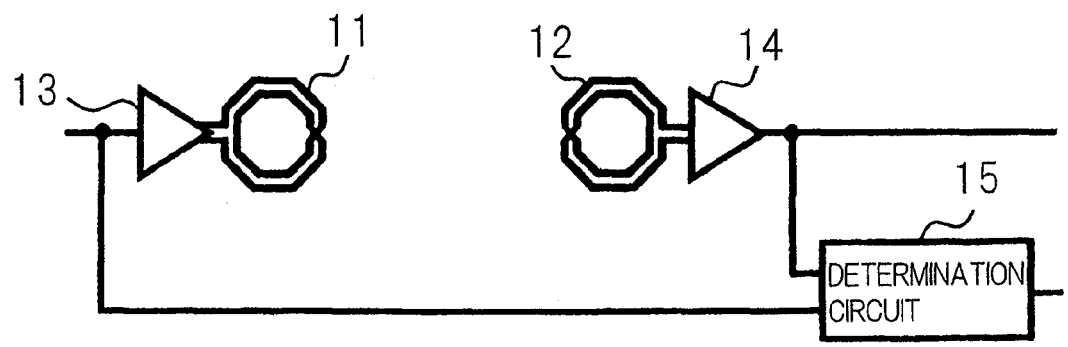

FIG. 2 include diagrams showing positional relationships between transmission coil 11 and reception coil 12 provided on substrate 10 shown in FIG. 1.

If transmission coil 11 is disposed in reception coil 12 as shown in FIG. 2(a), the coupling coefficient $k_{11}$, which indicates the strength of the inductive coupling between transmission coil 11 and reception coil 12, is close to 1. Therefore, reception circuit 14 cannot perform a receiving operation while transmission circuit 13 is performing a transmitting operation.

On the other hand, if transmission coil 11 and reception coil 12 are spaced apart from each other as shown in FIG. 2(b), the coupling coefficient $k_{11}$ for the inductive coupling between transmission coil 11 and reception coil 12 is close to 0. Therefore, reception circuit 12 can perform a receiving operation even while transmission circuit 13 is performing a transmitting operation.

Figure 3:
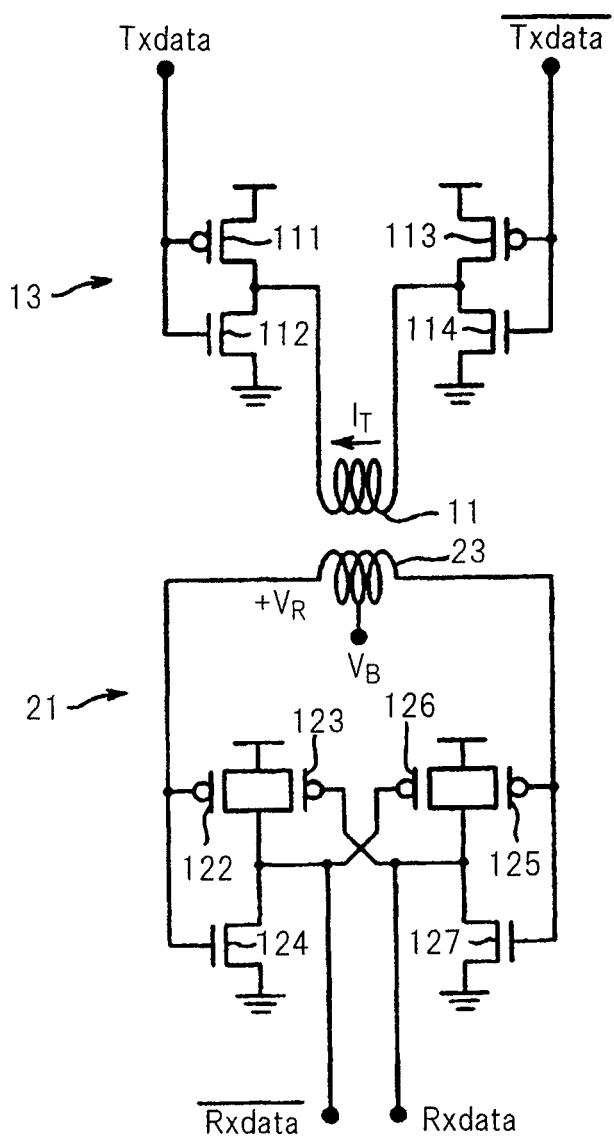
FIG. 3 is a circuit diagram showing a specific configuration of transmission coil 11, reception coil 23, transmission circuit 13 and reception circuit 21 shown in FIG. 1.
Figure 4:
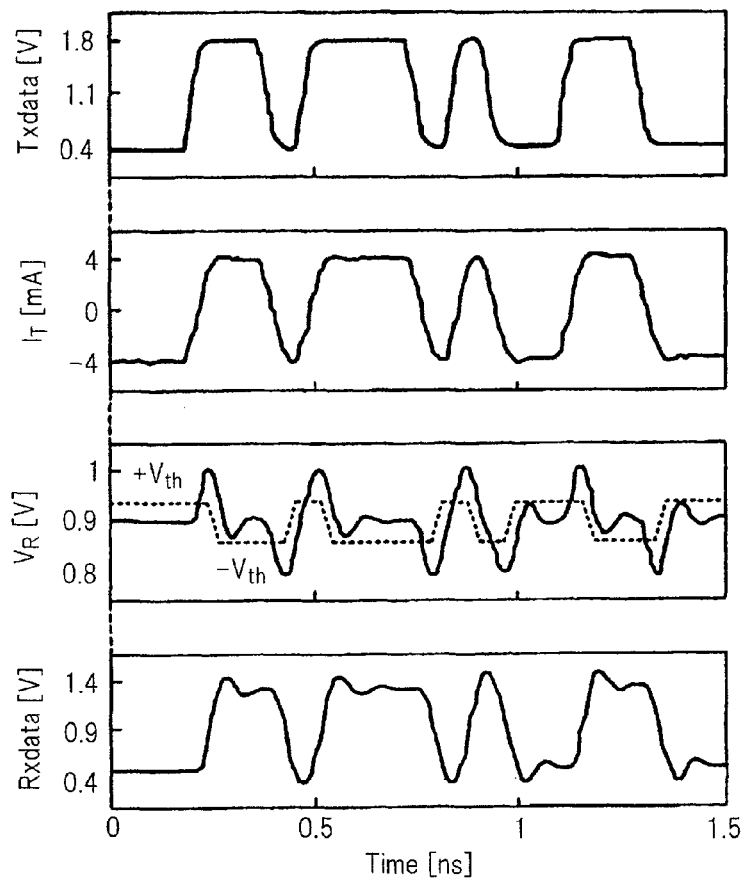
FIG. 4 shows operational waveforms of components of the circuit shown in FIG. 3.

FIG. 3 is a circuit diagram showing a specific configuration of transmission coil 11, reception coil 23, transmission circuit 13 and reception circuit 21 shown in FIG. 1. FIG. 4 shows operational waveforms of the components of the circuit shown in FIG. 3.

Transmission circuit 13 comprises transistors 111 to 114. Each transistor is driven directly by the transmission data Txdata and applies a transmission current $I_T$ having the same waveform as the transmission data Txdata to transmission coil 11. The transmission current $I_T$ induces a positive or negative pulse voltage $V_R$ in reception coil 23, which is inductively coupled to transmission coil 11.

Reception circuit 21 comprises transistors 122 to 127. Reception coil 23 is biased to a voltage $V_B$ that is about half of the power supply voltage. If the transmission data Txdata changes from LOW to HIGH with respect to the voltage $V_B$, a positive pulse voltage occurs in reception coil 23. If the transmission data Txdata changed from HIGH to LOW with respect to the voltage $V_B$, a negative pulse voltage occurs in reception coil 23.

Reception circuit 21 serves as a hysteresis comparator, which comprises a gain circuit and a latch circuit. The gain circuit includes inverters formed by transistors 122 and 124 and by transistors 125 and 127. The opposite ends of reception coil 23 are connected to the gates of the inverters of the gain circuit, and the gain circuit amplifies the input pulse voltage $V_R$. If the pulse voltage $V_R$ exceeds a certain threshold, the reception data Rxdata is inverted.

The latch circuit is formed by cross-coupled PMOS transistors 123 and 126 connected to the outputs of the inverters at their gates. The latch circuit has a capability of holding the reception data Rxdata and can correctly reproduce digital data from the pulse voltage $V_R$.

The latch circuit changes the threshold for the input inverter in accordance with the data held therein. The dotted line shown along with the waveform of the pulse voltage $V_R$ in FIG. 4 indicates a variation of the threshold for the inverter formed by transistors 122 and 124. If the latch circuit initially holds LOW as the reception data Rxdata, the latch circuit sets the threshold for the inverter to be $+V_{th}$ higher. If a positive pulse input exceeds the threshold, the reception data Rxdata is inverted to HIGH. After that, the latch circuit sets the threshold for the inverter to be $-V_{th}$ lower and holds the reception data Rxdata until a negative pulse voltage exceeding the threshold is input. By repeating this process, digital data can be correctly reproduced from the positive and negative pulse voltage.

A reception voltage signal $V_{R2}$ generated by reception coil 23 is expressed by the following formula.

[expression 1]

$$V_{R2} = k_{12}\sqrt{L_{T1}L_{R2}}\,\delta, \quad \delta = \frac{dI_T}{dt}. \tag{1}$$

In this formula, $\delta$ represents a temporal variation rate of the current $I_T$ applied to transmission coil 11. Representatively, $k_{12}=0.2$, $L_{T1}=L_{R2}=10$ nH, and $\sigma=10$ mA/100 psec. Under these conditions, $V_{R2}=0.2$.

For testing the inductive coupling-based radio communication in advance of stacking, the inductive coupling between transmission coil 11 and reception coil 12 is used. A reception voltage signal $V_{R1}$ generated by reception coil 12 is expressed by the following formula.

[expression 2]

$$V_{R1} = k_{11}\sqrt{L_{T1}L_{R1}}\,\delta_{test}. \tag{2}$$

In this formula, $\delta_{test}$ represents a temporal variation rate of the current $I_T$ applied to transmission coil 12 during the test.

In order that reception coil 12 generates a reception signal $V_{R1}$ that is the same as that generated during practical radio communication between the substrates, that is, in order to meet a requirement that $V_{R1}=V_{R2}$, the following condition has to be satisfied.

[expression 3]

$$\delta_{test} = \frac{k_{12}}{k_{11}}\sqrt{\frac{L_{R2}}{L_{R1}}}\cdot\delta. \tag{3}$$

For example, in the case where reception coils 12 and 23 have the same shape ($L_{R1}=L_{R2}$), reception coil 12 generates a reception voltage signal $V_{R1}$ that is equal to the reception voltage signal $V_{R2}$ induced in reception coil 23 during communication if the temporal variation rate of the current $I_T$ applied to transmission coil 11 during testing is set to be $k_{12}/k_{11}$ times the temporal variation rate during communication. A representative value of $k_{12}$ is 0.2. In the case shown in FIG. 2(a), $k_{11}$ is close to 1. Thus, during testing, the current $I_T$ applied to transmission coil 11 can be changed with a temporal variation rate $\delta$ of about one-fifth of the temporal variation rate during communication.

In practice, a design margin is typically provided for factors that decrease the quality of the inductive coupling, such as variations in manufacturing methods, misalignment of the stacked chips, variations in power supply voltage or temperature and circuit noise. For similar reasons, the test is typically conducted under slightly stricter conditions. In particular, for the apparatus comprising a stack of a large number of chips described in Problems to be solved by the Invention, minimizing the fraction defective of the chips is advantageous for reducing the fraction defective of the apparatus. Accordingly, a test may be conducted under the condition in which $V_{R1}<V_{R2}$, that is, the following condition must be satisfied:

[expression 4]

$$\delta_{test} < \frac{k_{12}}{k_{11}}\sqrt{\frac{L_{R2}}{L_{R1}}}\cdot\delta \tag{4}$$

Embodiment 2

Figure 5:
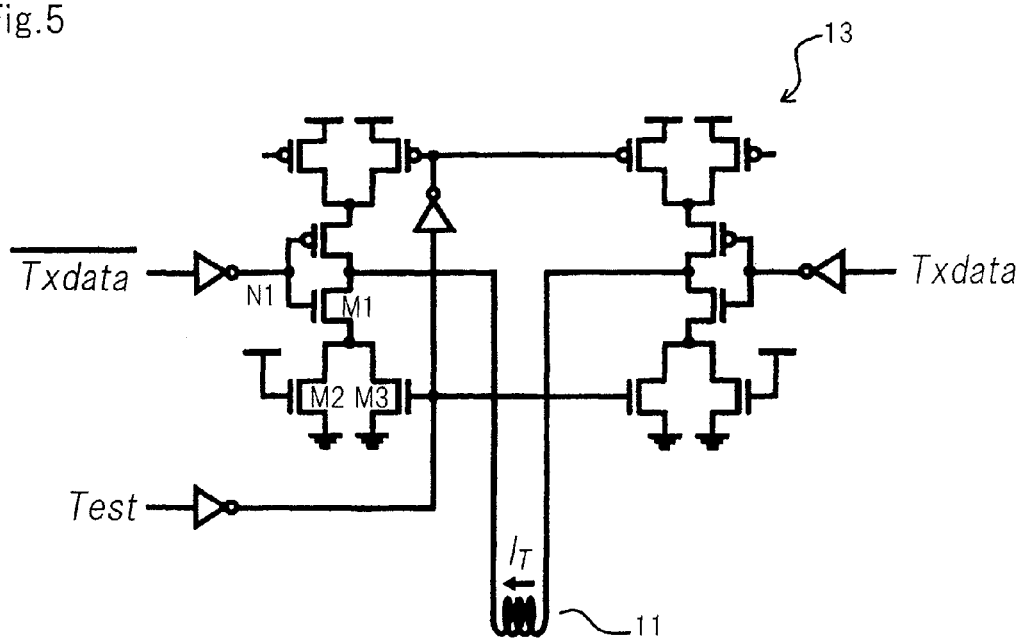
FIG. 5 is a circuit diagram showing another exemplary configuration of transmission circuit 13.

FIG. 5 is a circuit diagram showing another exemplary configuration of transmission circuit 13. In this embodiment, the temporal variation rate of the current $I_T$ applied to transmission coil 11 during testing is more precisely set than during communication.

During communication, LOW is input to a Test terminal, and transistor M3 is turned on. Transistor M2 is always kept on, and therefore, when the transmission data Txdata becomes HIGH to raise the status of a node N1 to HIGH, three transistors M1, M2 and M3 are turned on to apply the current $I_T$ to transmission coil 11.

During testing, HIGH is input to the Test terminal, and the transistor M3 is turned off. Transistor M2 is always kept on, and therefore, when the transmission data Txdata becomes HIGH to raise the status of the node N1 to HIGH, two transistors M1 and M2 are turned on to apply the current $I_T$ to transmission coil 11. For example, if transistors M1, M2 and M3 have a channel width of 20 μm, 2 μm and 20 μm, respectively, the value of the current $I_T$ during testing can be set about one-fifth of that during communication.

Assuming that a transistor having a channel width of 20 μm has an on-resistance of 50Ω, the total resistance of the transistors during communication is about 95Ω, because transistor M1 having a resistance of 50Ω is connected in series with a parallel connection of transistor M2 having a resistance of 500Ω and transistor M3 having a resistance of 50Ω. Therefore, if the power supply voltage is 1 V, the current $I_T$ is about 10 mA.

During testing, the total resistance of the transistors is 550Ω, because transistor M1 having a resistance of 50Ω is connected in series with transistor M2 having a resistance of 500Ω. Therefore, if the power supply voltage is 1 V, the current $I_T$ is about 2 mA. The current $I_T$ during testing is about one-fifth of that during communication. Although this is an approximate calculation that does not take into consideration the non-linear effect of the transistors or the resistance of the coils, the accurate ratio can be easily determined by using a circuit simulator.

The temporal variation rate of the current $I_T$ also depends on the time required for the status of the node N1 to change from LOW to HIGH (representatively, 100 psec). Since transistor M1 is turned on when the status of node N1 changes from LOW to HIGH both during communication and during testing, the capacity at node N1 is the same during communication and during testing. Therefore, the time required for the status of the node N1 to change from LOW to HIGH is also the same during communication and during testing.

As can seen from the above description, the temporal variation rate of the current $I_T$ applied to the first transmission coil during testing can be set to be $k_{12}/k_{11}$ times the temporal variation rate during communication by appropriately setting the channel width of transistors M1, M2 and M3. For example, even if the threshold voltage of the transistor varies among chips, or the power supply voltage varies with time, the ratio of the temporal variation rate of the current $I_T$ is less affected.

Embodiment 3

Figure 6:
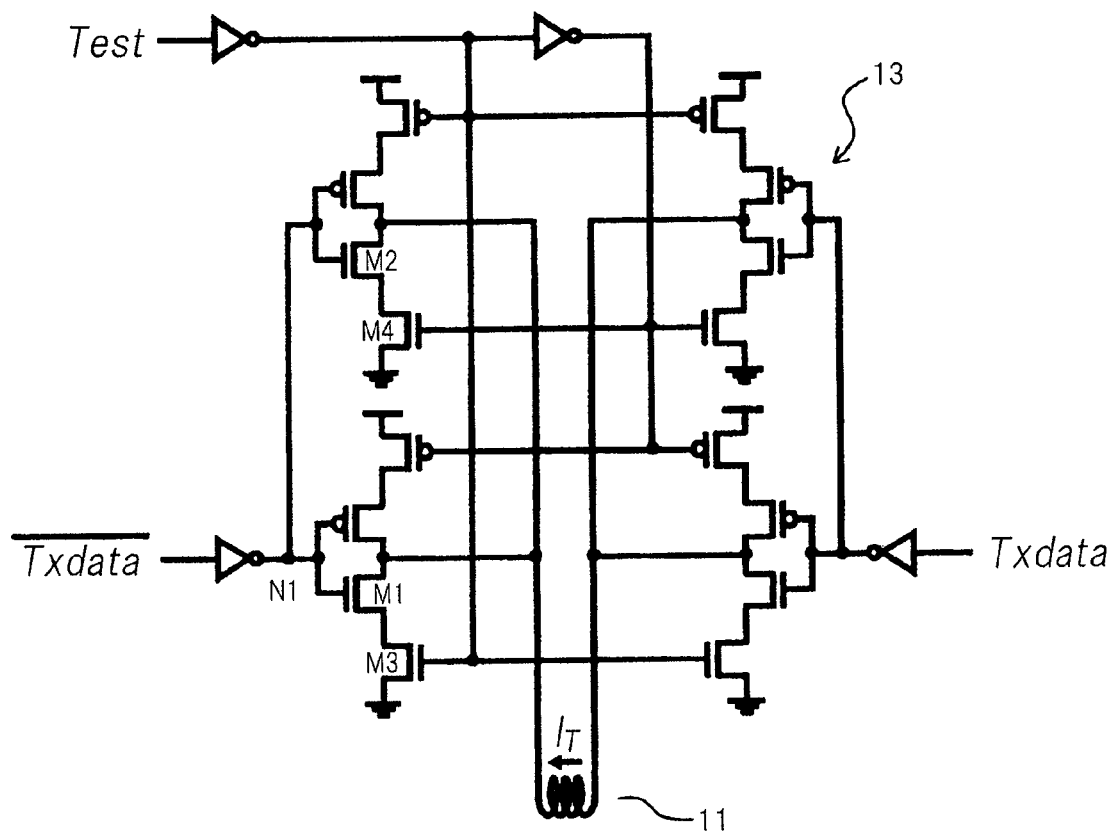
FIG. 6 is a circuit diagram showing another exemplary configuration of transmission circuit 13.

FIG. 6 is a circuit diagram showing another exemplary configuration of transmission circuit 13. LOW is input to the Test terminal, transistor M3 is turned on, and transistor M4 is turned off. When the transmission data Txdata becomes HIGH to raise the status of the node N1 to HIGH, two transistors M1 and M3 are turned on to apply the current $I_T$ to transmission coil 11.

On the other hand, during testing, HIGH is input to the Test terminal, transistor M4 is turned on, and transistor M3 is turned off. When the transmission data Txdata becomes HIGH to raise the status of the node N1 to HIGH, two transistors M2 and M4 are turned on to apply the current $I_T$ to transmission coil 11.

For example, if transistors M1, M2, M3 and M4 have a channel width of 20 μm, 4 μm, 20 μm and 4 μm, respectively, the value of current $I_T$ during testing can be about one-fifth of that during communication.

For this circuit, however, the time required for the status of node N1 to change from LOW to HIGH differs during testing and during communication. During communication, transistor M4 is turned off, and therefore, transistor M2 is not turned on. If a transistor is turned off and provides no channel, capacitance of a depletion layer is formed in series with the capacitance of the gate insulating film between the gate and the semiconductor substrate, so that the gate capacity is lower than that of the transistor that is turned on. In other words, the gate capacity of the transistor M2 during communication is lower than that during testing.

On the other hand, during testing, transistor M3 is turned off, and therefore, transistor M1 is not turned on. Accordingly, the gate capacity of transistor M1 during testing is lower than that during communication. Thus, the capacity at node N1 differs during communication and during testing, so that it is not easy to accurately set the temporal variation rate of the current $I_T$. The circuit shown in FIG. 5 is advantageous over the circuit shown in FIG. 6 in this respect.

Embodiment 4

Figure 7:
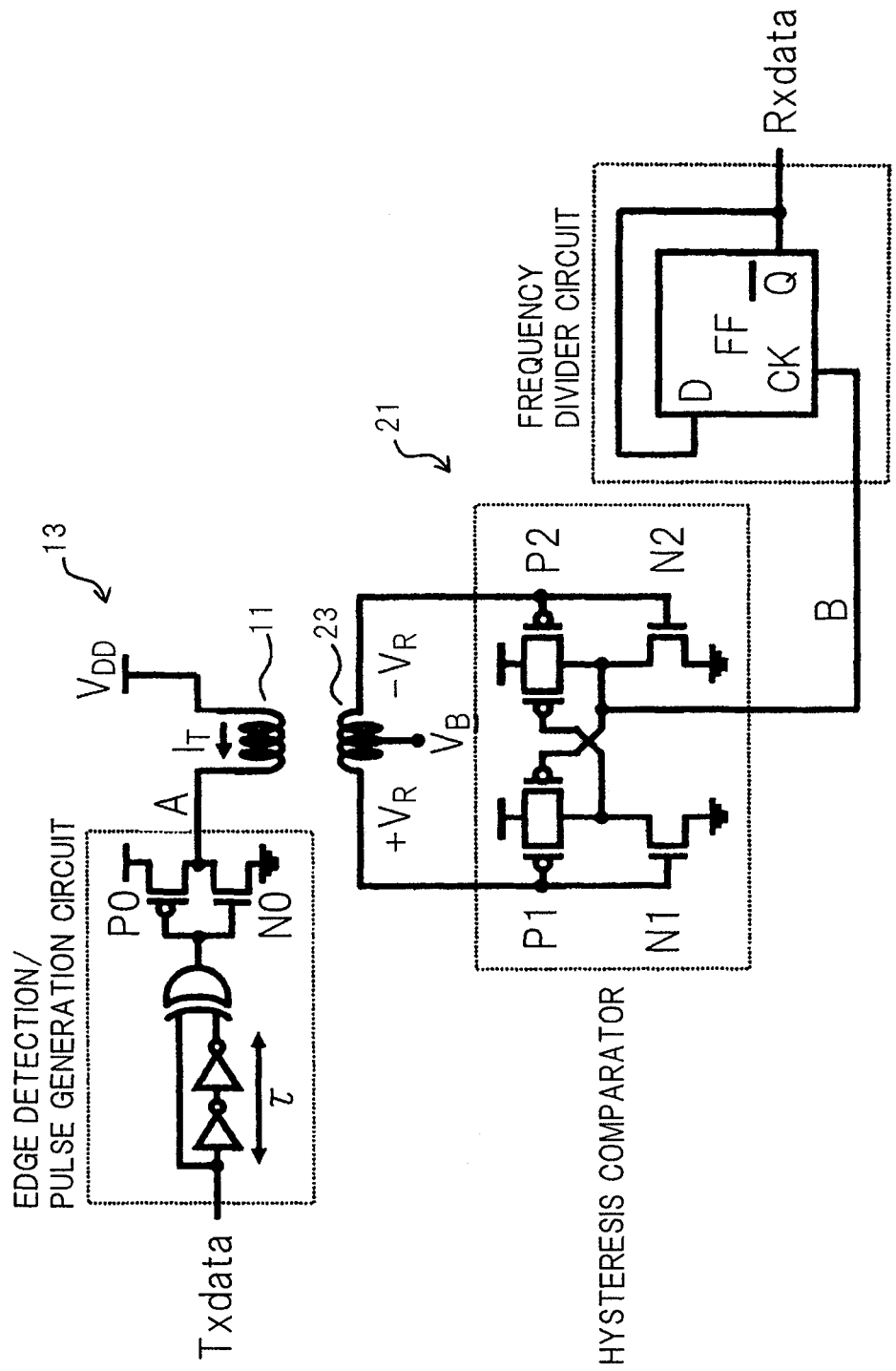
FIG. 7 is a circuit diagram showing another specific configuration of transmission coil 11, reception coil 23, transmission circuit 13 and reception circuit 21 shown in FIG. 1.
Figure 8:
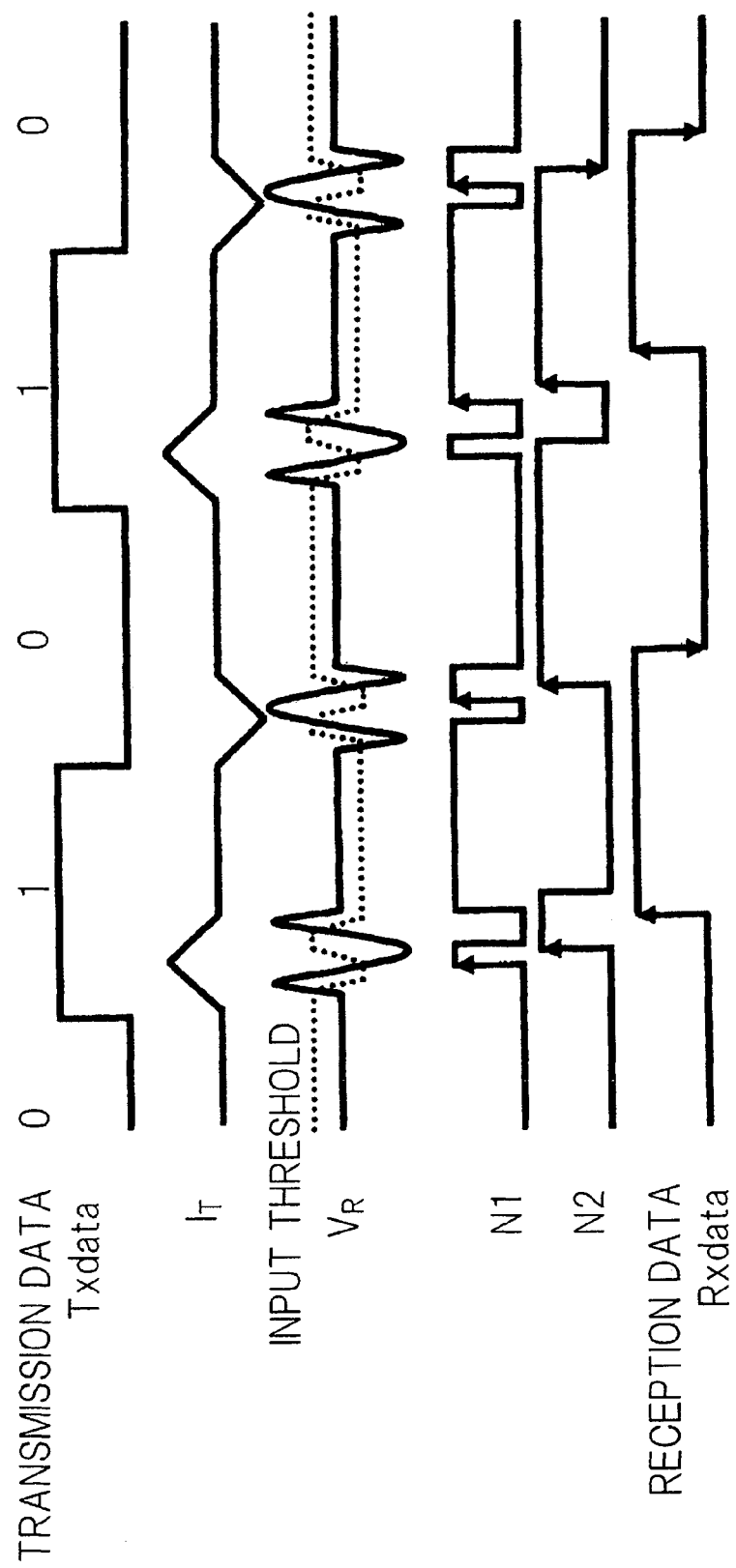
FIG. 8 shows operational waveforms of components of the circuit shown in FIG. 7.

FIG. 7 is a circuit diagram showing another specific configuration of transmission coil 11, reception coil 23, transmission circuit 13 and reception circuit 21 shown in FIG. 1. FIG. 8 shows operational waveforms of the components in the circuit shown in FIG. 7.

Transmission circuit 13 comprises a circuit (an edge detection/pulse generation circuit) that detects a change in transmission data Txdata to generate a pulse and changes the potential at one end of transmission coil 11, which is connected to a power supply (VDD or VSS) at the other end.

Reception circuit 21 comprises a hysteresis comparator and a frequency divider circuit. Reception coil 23 is connected to the hysteresis comparator at the opposite ends, and the frequency divider circuit inverts digital data at a rising edge (a point in time when the signal changes from LOW to HIGH) or a falling edge (a point in time when the signal changes from HIGH to LOW) of the output signal of the hysteresis comparator. Reception circuit 21 outputs reception data Rxdata via the frequency divider circuit.

For example, the edge detection/pulse generation circuit has a two-input exclusive-OR gate, the transmission data Txdata is input to the two inputs of the exclusive-OR gate with a time lag of τ, and the edge detection/pulse generation circuit outputs a pulse signal having a duration of τ. Thus, an NMOS transistor (N0) in the output stage is kept on and applies the current $I_T$ to transmission coil 11 for the time τ and then is turned off. Even after that, the current $I_T$ continues to flow in transmission coil 11 for a while because of the inductance of transmission coil 11 but eventually decreases to zero.

The output stage may be formed only by the NMOS transistor. In that case, however, after the NMOS transistor is turned off, the potential $V_R$ or the current $I_T$ in transmission coil 11 may resonate because of the inductance and parasitic capacitance of transmission coil 11 and hinder transmission and reception. To avoid the resonance, a PMOS transistor (P0) can be added to the output stage to form an inverter circuit, in which the transistor P0 is turned on when the transistor N0 is turned off. The channel width of the transistor P0 can be small enough to prevent transmission coil 11 from resonating.

The hysteresis comparator outputs a pulse signal each time the transmission data Txdata varies, as shown in FIG. 8. The pulse signal has a width of about 0.5τ. The transmission data Txdata can be reproduced by generating digital data that is alternately inverted at the rising edge or falling edge of the pulse.

Embodiment 5

Figure 9:
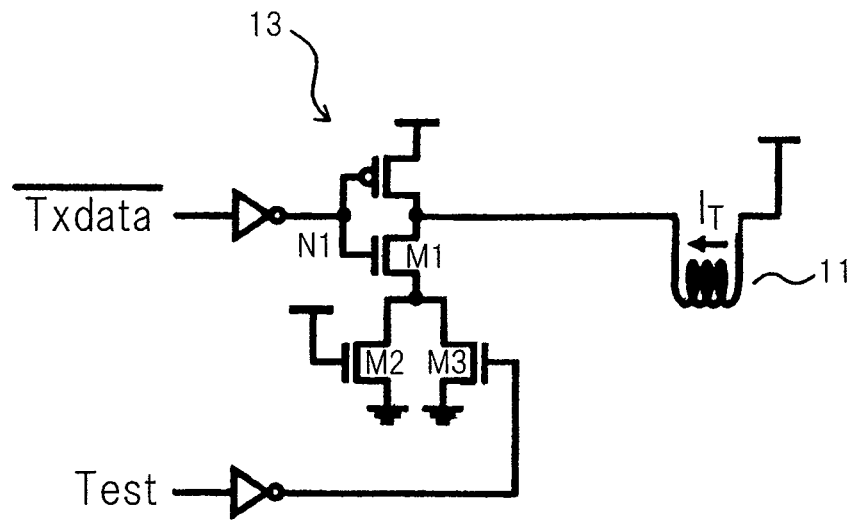
FIG. 9 is a circuit diagram showing another exemplary configuration of transmission circuit 13.

FIG. 9 is a circuit diagram showing another exemplary configuration of transmission circuit 13.

During communication, LOW is input to the Test terminal, and transistor M3 is turned on. Since transistor M2 is always kept on, when the transmission data Txdata becomes HIGH to raise the status of the node N1 to HIGH, three transistors M1, M2 and M3 are turned on to apply current $I_T$ to transmission coil 11.

During testing, HIGH is input to the Test terminal, and transistor M3 is turned off. Since transistor M2 is always kept on, when the transmission data Txdata becomes HIGH to raise the status of the node N1 to HIGH, two transistors M1 and M2 are turned on to apply current $I_T$ to transmission coil 11.

Embodiment 6

Figure 10:
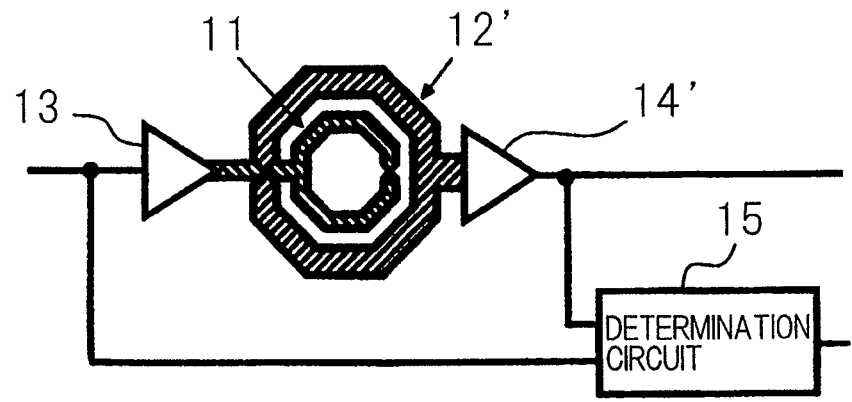
FIGS. 10(a) and 10(b) show other examples of the transmission coil and the reception coil provided on substrate 10 shown in FIG. 1.
Figure 10:
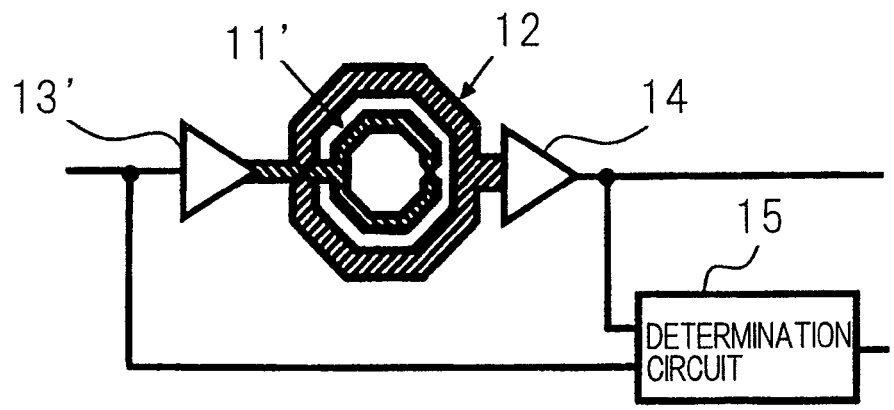
Figure 11:
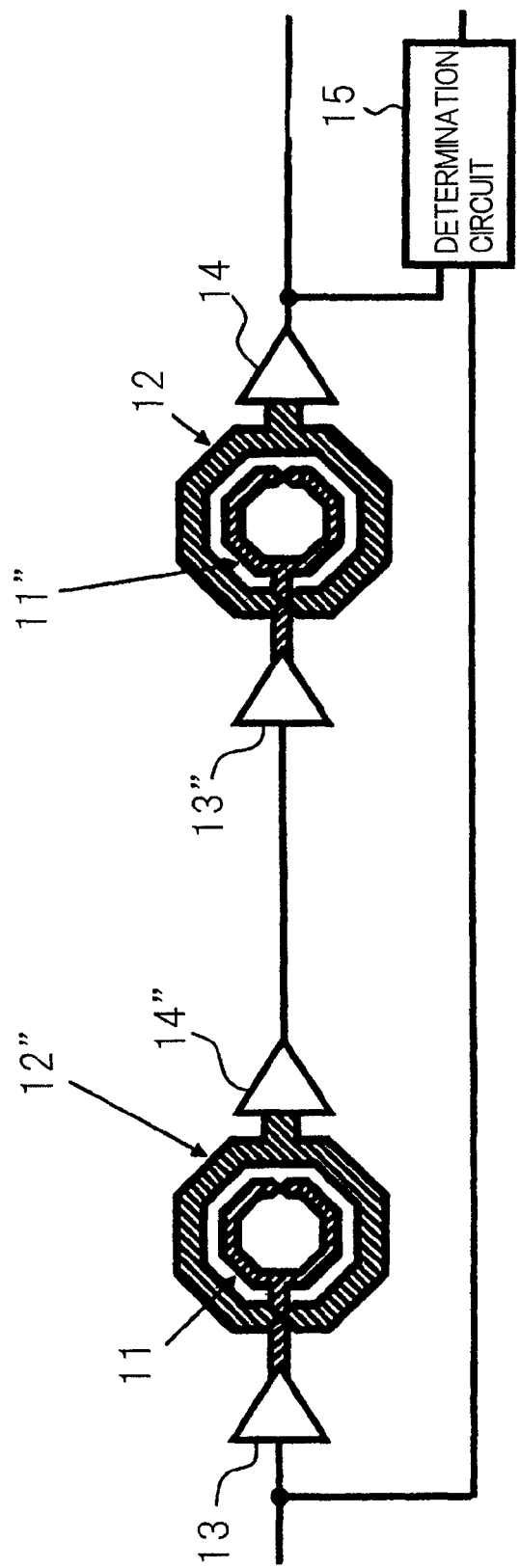
FIG. 11 shows another example of the transmission coil and the reception coil provided on substrate 10 shown in FIG. 1.

FIGS. 10 and 11 show other exemplary configurations of the transmission coil(s) and the reception coil(s) provided on substrate 10 shown in FIG. 1.

The coupling coefficient $k_{11}$ is close to 1 in the case shown in FIG. 2(a) and is close to 0 in the case shown in FIG. 2(b). Therefore, $k_{12}/k_{11}$ is greater than 1. For example, if $k_{11}$ is 0.02 and $k_{12}$ is 0.2, $k_{12}/k_{11}$ is 10. This means that the current has to be changed 10 times more significantly during testing than during transmission, which can lead to a larger footprint of the circuit and therefore a higher cost.

In addition, the circuit capable of supplying such a high current cannot be always prepared. In the case where such a circuit cannot be prepared, a testing coil and a testing transmission or reception circuit are additionally provided near reception coil 12 or transmission coil 11. Specifically, testing reception coil 12' and testing reception circuit 14' are provided near transmission coil 11 as shown in FIG. 10(a), or testing transmission coil 11' and testing transmission circuit 13' are provided near reception coil 12 as shown in FIG. 10(b), to separately test the receiver and the transmitter.

In the case where either the transmitter or the receiver is provided on substrate 10, either a testing receiver or a testing transmitter is added for testing. Alternatively, as shown in FIG. 11, testing transmission coil 11'', testing transmission circuit 13'', testing reception coil 12'' and testing reception circuit 14'' may be connected between transmission coil 11 and reception coil 12 to test the receiver and the transmitter at once.

Embodiment 7

Figure 12:
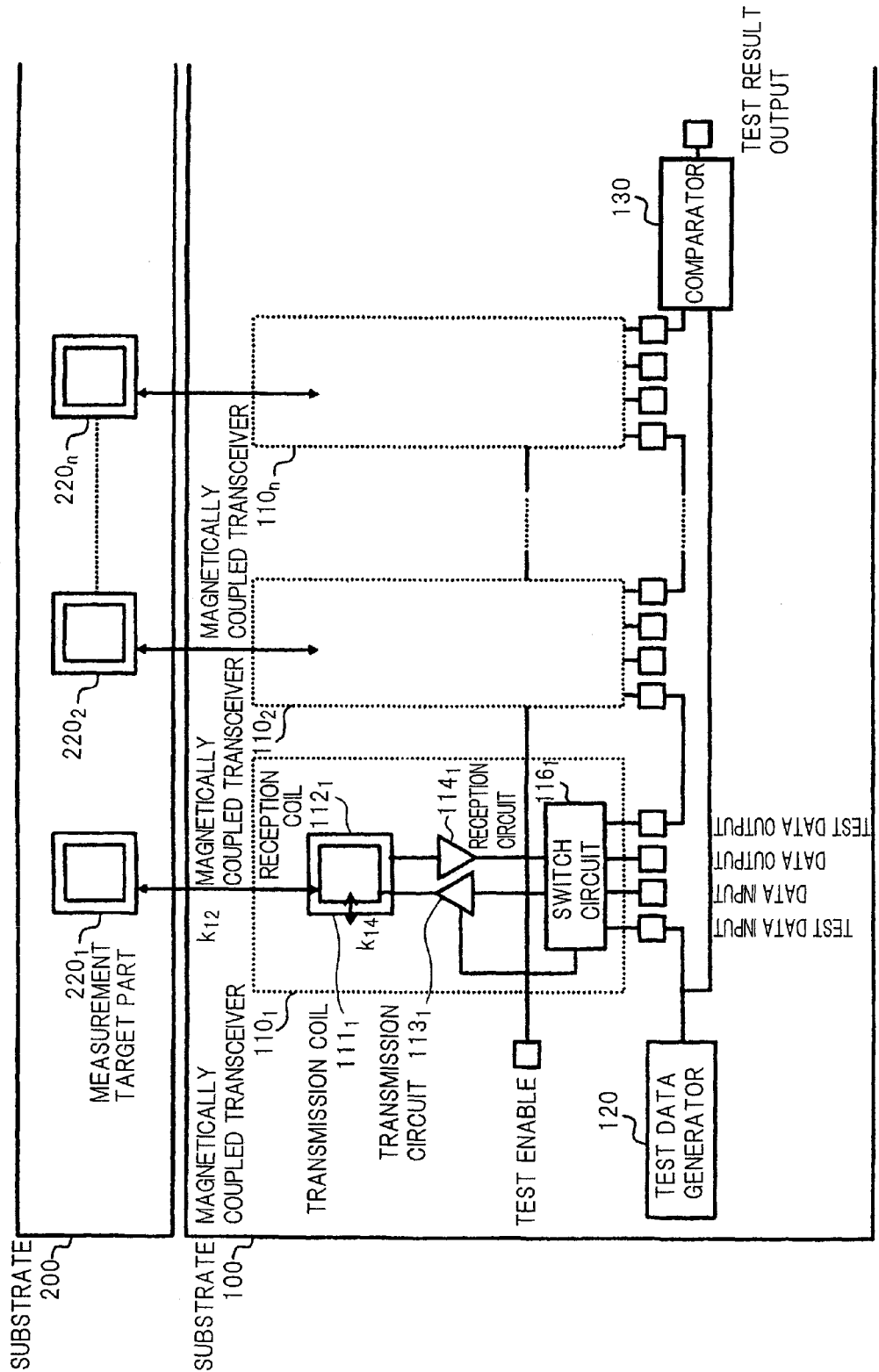
FIG. 12 is a block diagram showing a configuration of another embodiment of the present invention.

FIG. 12 is a block diagram showing a configuration of another embodiment of the present invention.

This embodiment is designed to test a plurality of transceivers at once. A plurality of magnetically coupled transceivers $110_1$ to $110_n$, each of which is equivalent to substrate 10 shown in FIG. 1, are mounted on substrate 100 and connected in series with each other. A plurality of measurement target parts $220_1$ to $220_n$, each of which is equivalent to substrate 20 shown in FIG. 1, are mounted on substrate 200 and magnetically coupled to the corresponding magnetically coupled transceivers $110_1$ to $110_n$.

In addition to magnetically coupled transceivers $110_1$ to $110_n$, test data generator 120 and comparator 130 are mounted on substrate 100.

Magnetically coupled transceivers $110_1$ to $110_n$ have the same configuration. As an example, an internal configuration of magnetically coupled transceiver $110_1$ will be described below.

Magnetically coupled transceiver $110_1$ comprises transmission coil $111_1$, reception coil $112_1$, transmission circuit $113_1$ and reception circuit $114_1$ that serve the same functions as transmission coil 11, reception coil 12, transmission circuit 13 and reception circuit 14 shown in FIG. 1, respectively, and switch circuit $116_1$.

Switch circuit $116_1$ has a test data input terminal at which a signal from test data generator 120 is input, a test data output terminal at which a test result is output, and a data input terminal and a data output terminal used for a normal communication operation, and is connected to a test enable terminal that is activated for testing.

The plurality of magnetically coupled transceivers are connected in series with each other by connecting the test data output terminal of each magnetically coupled transceiver to the test data output terminal of the following magnetically coupled transceiver (for example, the test data output terminal of magnetically coupled transceiver $110_1$ is connected to the test data input terminal of magnetically coupled transceiver $110_2$). The test data output terminal of the last magnetically coupled transceiver $110_n$ is connected to one input of comparator 130. The other input of comparator 130 is connected to the output of test data generator 120. Comparator 130 compares the two inputs to determine whether the inputs agree with each other and outputs the result of the determination as a test result output.

According to this embodiment configured as described above, since the plurality of magnetically coupled transceivers $110_1$ to $110_n$ are connected in series with each other, the transmission/reception functionality of all of magnetically coupled transceivers $110_1$ to $110_n$ and measurement target parts $220_1$ to $220_n$ can be tested at once. This embodiment can be applied to any of the embodiments described earlier.

Test data generator 120 according to this embodiment may be a pseudo random data generator circuit. The switch circuit and comparator 130 can be easily prepared from a digital CMOS circuit. If the Test terminal of the transmission circuit shown in FIGS. 5, 6 and 9 is connected to the test enable terminal, the temporal variation rate δ can be different between during testing and during communication.

Embodiment 8

As shown in Embodiment 1, in order that the first reception coil generates, during testing, a reception signal $V_{R1}$ that is the same as that generated during communication between the substrates inductively coupled to each other, that is, in order to meet a requirement that $V_{R1}=V_{R2}$, the condition expressed by the formula (3) has to be satisfied.

The test may be conducted under easier conditions than during practical communication, such as the following condition:

[expression 5]

$$\delta_{test} > \frac{k_{12}}{k_{11}}\sqrt{\frac{L_{R2}}{L_{R1}}} \cdot \delta \quad (5)$$

In the case shown in FIG. 2(a), the test is conducted under the condition in which the value of σ is greater than 0.2 times the value of σ during communication. This condition is satisfied if the same transmission circuit is used during testing and during communication. This embodiment has the advantage that no other circuit needs to be added to the transmission circuit. According to this embodiment, however, only functional defects, such as an open circuit or short circuit and a breakage of the gate oxide film of a transistor, can be detected.

REFERENCE SIGNS LIST 11, 22 transmission coil
12, 23 reception coil
13, 21 transmission circuit
14, 21 reception circuit
15 determination circuit

The invention claimed is:
1. A communication functionality inspection method performed in the electronic circuit comprising
   a first substrate;
   a first transmission coil that is formed by a wire and transmits a signal;
   a first transmission circuit that outputs a signal to said first transmission coil;
   a first reception coil that is formed by a wire at such a position that the first reception coil is inductively coupled to said first transmission coil and receives the signal from said first transmission coil;
   a first reception circuit that receives the signal from said first reception coil;
   a first determination circuit that compares data input to said first transmission circuit and data output from said first reception circuit;
   a second substrate;
   a second reception coil that is formed by a wire at such a position that the second reception coil is inductively coupled to said first transmission coil and receives the signal from said first transmission coil; and
   a second reception circuit that receives a signal from said second reception coil,
   wherein the second reception coil and the second reception circuit are mounted on said second substrate, wherein the first transmission coil, the first transmission circuit, the first reception coil, the first reception circuit and the first determination circuit are mounted on said first substrate, wherein a communication functionality between said first substrate and said second substrate is inspected by said first determination circuit comparing a signal transmitted from said first transmission circuit and a signal received by said first reception circuit, wherein said first transmission circuit is capable of setting a temporal variation rate δ of a current applied to said first transmission coil at any value, said method comprising setting the temporal variation rate $\delta_{test}$ of the current applied to said first transmission coil during testing to be $[(k_{12}/k_{11})\times\surd(L_{R2}/L_{R1})\}]$ times the temporal variation rate δ of the current applied to said first transmission coil during communication from said first substrate to said second substrate, where $k_{11}$ represents a coupling coefficient of the inductive coupling between said first transmission coil and said first reception coil, $k_{12}$ represents a coupling coefficient of the inductive coupling between said first transmission coil and said second reception coil, $L_{R1}$ represents an inductance of said first reception coil, and $L_{R2}$ represents an inductance of said second reception coil.

2. A communication functionality inspection method performed in the electronic circuit a first substrate;
a first transmission coil that is formed by a wire and transmits a signal;
a first transmission circuit that outputs a signal to said first transmission coil;
a first reception coil that is formed by a wire at such a position that the first reception coil is inductively coupled to said first transmission coil and receives the signal from said first transmission coil;
a first reception circuit that receives the signal from said first reception coil;
a first determination circuit that compares data input to said first transmission circuit and data output from said first reception circuit;
a second substrate;
a second reception coil that is formed by a wire at such a position that the second reception coil is inductively coupled to said first transmission coil and receives the signal from said first transmission coil; and
a second reception circuit that receives a signal from said second reception coil,
wherein the second reception coil and the second reception circuit are mounted on said second substrate,
wherein the first transmission coil, the first transmission circuit, the first reception coil, the first reception circuit and the first determination circuit are mounted on said first substrate,
wherein a communication functionality between said first substrate and said second substrate is inspected by said first determination circuit comparing a signal transmitted from said first transmission circuit and a signal received by said first reception circuit,
wherein said first transmission circuit is capable of setting a temporal variation rate δ of a current applied to said first transmission coil at any value,
said method comprising setting the temporal variation rate $\delta_{test}$ of the current applied to said first transmission coil during testing to be equal to the temporal variation rate B of the current applied to said first transmission coil during communication from said first substrate to said second substrate.

3. A communication functionality inspection method performed in the electronic circuit comprising:
a first substrate;
a first transmission coil that is formed by a wire and transmits a signal;
a first transmission circuit that outputs a signal to said first transmission coil;
a first reception coil that is formed by a wire at such a position that the first reception coil is inductively coupled to said first transmission coil and receives the signal from said first transmission coil;
a first reception circuit that receives the signal from said first reception coil;
a first determination circuit that compares data input to said first transmission circuit and data output from said first reception circuit;
a second substrate;
a second transmission coil that is formed by a wire at such a position that the second transmission coil is inductively coupled to said first reception coil and transmits a final to said first reception coil; and
a second transmission circuit that outputs a signal to said second transmission coil,
wherein the second transmission coil and the second transmission circuit are mounted on said second substrate,
wherein the first transmission coil, the first transmission circuit, the first reception coil, the first reception circuit and the first determination circuit are mounted on said first substrate,
wherein a communication functionality between said first substrate and said second substrate is inspected by said first determination circuit comparing a signal transmitted from said first transmission circuit and a signal received by said first reception circuit, and
wherein said first transmission circuit is capable of setting a temporal variation rate δ of a current applied to said first transmission coil at any value,
said method comprising:
setting the temporal variation rate $\delta_{test}$ of the current applied to said first transmission coil during testing to be $[(k_{12}/k_{11})\times\surd(L_{R2}/L_{R1})]$ times the temporal variation rate δ of the current applied to said first transmission coil during communication from said first substrate to said second substrate, where $k_{11}$ represents a coupling coefficient of the inductive coupling between said first transmission coil and said first reception coil, $k_{12}$ represents a coupling coefficient of the inductive coupling between said first transmission coil and said second reception coil, $L_{R1}$ represents an inductance of said first reception coil, and $L_{R2}$ represents an inductance of said second reception coil, and
comparing a signal transmitted from said first transmission circuit and a signal received by said first reception circuit by said first determination circuit so as to inspect a communication functionality between said first substrate and said second substrate.

4. A communication functionality inspection method performed in the electronic circuit comprising:
a first substrate;
a first transmission coil that is formed by a wire and transmits a signal;
a first transmission circuit that outputs a signal to said first transmission coil;
a first reception coil that is formed by a wire at such a position that the first reception coil is inductively coupled to said first transmission coil and receives the signal from said first transmission coil;

a first reception circuit that receives the signal from said first reception coil; and
a first determination circuit that compares data input to said first transmission circuit and data output from said first reception circuit;
a second substrate;
a second reception coil that is formed by a wire at such a position that the second reception coil is inductively coupled to said first transmission coil and receives the signal from said first transmission coil;
a second reception circuit that receives a signal from said second reception coil;
a second transmission coil that is formed by a wire such that a position that the second transmission coils is inductively coupled to said first reception coil and transmits a final to said first reception coil; and
a second transmission circuit that outputs a signal to said second transmission coil;
wherein the second transmission coil, the second reception circuit, the second transmission coil, and the second transmission circuit are mounted on said second substrate
wherein the first transmission coil, the first transmission circuit, the first reception coil, the first reception circuit and the first determination circuit are mounted on said first substrate,
wherein a communication functionality between said first substrate and said second substrate is inspected by said first determination circuit comparing a signal transmitted from said first transmission circuit and a signal received by said first reception circuit, and
wherein said first transmission circuit is capable of setting a temporal variation rate δ of a current applied to said first transmission coil at any value,
said method comprising:
setting the temporal variation rate $\delta_{test}$ of the current applied to said first transmission coil during testing to be $[(k_{12}/k_{11}) \times \sqrt{(L_{R2}/L_{R1})}]$ times the temporal variation rate δ of the current applied to said first transmission coil during communication from said first substrate to said second substrate, where $k_{11}$ represents a coupling coefficient of the inductive coupling between said first transmission coil and said first reception coil, $k_{12}$ represents a coupling coefficient of the inductive coupling between said first transmission coil and said second reception coil, $L_{R1}$ represents an inductance of said first reception coil, and $L_{R2}$ represents an inductance of said second reception coil, and
wherein comparing a signal transmitted from said first transmission circuit and a signal received by said first reception circuit by said first determination circuit so as to inspect a communication functionality between said first substrate and said second substrate.

5. A communication functionality inspection method performed in the electronic circuit comprising:
a first substrate;
a first transmission coil that is formed by a wire and transmits a signal;
a first transmission circuit that outputs a signal to said first transmission coil;
a first reception coil that is formed by a wire at such a position that the first reception coil is inductively coupled to said first transmission coil and receives the signal from said first transmission coil;
a first reception circuit that receives the signal from said first reception coil;
a first determination circuit that compares data input to said first transmission circuit and data output from said first reception circuit;
a second substrate;
a second transmission coil that is formed by a wire at such a position that the second transmission coil is inductively coupled to said first reception coil and transmits a signal to said first reception coil; and
a second transmission circuit that outputs a signal to said second transmission coil,
wherein the second transmission coil and the second transmission circuit are mounted on said second substrate,
wherein the first transmission coil, the first transmission circuit, the first reception coil, the first reception circuit and the first determination circuit are mounted on said first substrate,
wherein a communication functionality between said first substrate and said second substrate is inspected by said first determination circuit comparing a signal transmitted from said first transmission circuit and a signal received by said first reception circuit, and
wherein said first transmission circuit is capable of setting a temporal variation rate δ of a current applied to said first transmission coil at any value,
said method comprising:
setting the temporal variation rate δtest of the current applied to said first transmission coil during testing to be equal to the temporal variation rate B of the current applied to said first transmission coil during communication from said first substrate to said second substrate, and
comparing a signal transmitted from said first transmission circuit and a signal received by said first reception circuit by said first determination circuit so as to insect a communication functionality between said first substrate and said second substrate.

6. A communication functionality inspection method performed in the electronic circuit comprising:
a first substrate;
a first transmission coil that is formed by a wire and transmits a signal;
a first transmission circuit that outputs a signal to said first transmission coil;
a first reception coil that is formed by a wire at such a position that the first reception coil is inductively coupled to said first transmission coil and receives the signal from said first transmission coil;
a first reception circuit that receives the signal from said first reception coil;
a first determination circuit that compares data input to said first transmission circuit and data output from said first reception circuit;
a second substrate;
a second reception coil that is formed by a wire at such a position that the second reception coil is inductively coupled to said first transmission coil and receives the signal from said first transmission coil;
a second reception circuit that receives a signal from said second reception coil;
a second transmission coil that is formed by a wire such that a position that the second transmission coils is inductively coupled to said first reception coil and transmits a signal to said first reception coil; and
a second transmission circuit that outputs a signal to said second transmission coil;

wherein the second transmission coil, the second reception circuit, the second transmission coil, and the second transmission circuit are mounted on said second substrate, wherein the first transmission coil, the first transmission circuit, the first reception coil, the first reception circuit and the first determination circuit are mounted on said first substrate, wherein a communication functionality between said first substrate and said second substrate is inspected by said first determination circuit comparing a signal transmitted from said first transmission circuit and a signal received by said first reception circuit, and wherein said first transmission circuit is capable of setting a temporal variation rate $\delta$ of a current applied to said first transmission coil at any value, said method comprising:

setting the temporal variation rate $\delta_{test}$ of the current applied to said first transmission coil during testing is set to be equal to the temporal variation rate B of the current applied to said first transmission coil during communication from said first substrate to said second substrate, and comparing a signal transmitted from said first transmission circuit and a signal received by said first reception circuit by said first determination circuit so as to inspect a communication functionality between said first substrate and said second substrate.

* * * * *